(12) United States Patent
Hopkins

(10) Patent No.: US 8,310,293 B2
(45) Date of Patent: Nov. 13, 2012

(54) PWM SIGNAL GENERATOR FOR DIGITAL CONTROLLED POWER SUPPLY

(75) Inventor: Thomas L. Hopkins, Mundelein, IL (US)

(73) Assignee: STMicroelectronics, Inc., Coppell, TX (US)

( * ) Notice: Subject to any disclaimer, the term of this patent is extended or adjusted under 35 U.S.C. 154(b) by 346 days.

(21) Appl. No.: 12/796,278

(22) Filed: Jun. 8, 2010

(65) Prior Publication Data
US 2011/0298514 A1 Dec. 8, 2011

(51) Int. Cl.
*H03K 3/017* (2006.01)
(52) U.S. Cl. ............... 327/176; 327/142; 327/177
(58) Field of Classification Search ............ 327/173, 327/174, 175, 176, 177; 363/71, 16; 307/31
See application file for complete search history.

(56) References Cited

U.S. PATENT DOCUMENTS

| 5,898,329 A | 4/1999 | Hopkins | |
|---|---|---|---|
| 7,683,594 B2 * | 3/2010 | Kim et al. | 323/282 |

* cited by examiner

*Primary Examiner* — Shawn Riley
(74) *Attorney, Agent, or Firm* — Gardere Wynne Sewell LLP

(57) ABSTRACT

A forward converter circuit includes a transformer having a primary winding and a secondary winding. A first transistor is coupled in series with the primary winding and a second transistor is coupled in series with the secondary winding. A control circuit generates PWM control signals for controlling operation of the first and second transistors. The control signals are generated responsive to source PWM signals processed through programmable delay timers to generate set/reset control signals which set an output PWM control signal duty cycle.

23 Claims, 8 Drawing Sheets

PWM SIGNAL GENERATOR FOR DIGITAL CONTROLLED POWER SUPPLY

CROSS-REFERENCE TO RELATED APPLICATION

The present application includes subject matter related to that described in U.S. application for patent Ser. No. 12/507,661, filed Jul. 22, 2009, the disclosure of which is hereby incorporated by reference.

BACKGROUND

1. Technical Field

The present invention relates generally to digital power supplies and, more particularly, to a pulse width modulated (PWM) signal generator for use in a digital controlled power supply.

2. Description of Related Art

Forward power converters are well known in the art. These converters include a plurality of transistors each with a control terminal. Control signals are supplied to the control terminals with a certain phase relationship to each other in order to properly operate the converter. It is critical that the timing of operation of the transistors be carefully controlled. Timing circuits of varying types have been used to generate the control signals.

For example, the STM32 MCU from STMicroelectronics has been used to generate the control signals in a power converter application. The STM32 device is designed and optimized for three-phase motor control. As such, the circuit architecture is configured to control a three-phase bridge, and more specifically to control three half bridges. This bridge architecture shares some similarities with the power converter architecture, and further shares some PWM control similarities with power converter circuits.

While a motor controller needs to control only two transistors in a half bridge, the control operation for a power converter is more complex. In a single phase power converter, for example, two transistors must be controlled on the primary side, and one or more additional transistors must be controlled on the secondary side in order to achieve synchronous rectification. Also, if one desires to implement current control in addition to voltage control, one of the controlled switching events in the power converter must be triggered by a current detection (and not by the digital PWM generator).

To address the power converter control and timing needs, the timers provided by the STM32 MCU have been used to generate the transistor control signals. However, because the STM32 is designed for motor control and not power converter control, the use of the STM32 as the power converter control circuit is not optimized. A need exists for a control circuit having optimized control. Such a control circuit should support the use of programmable delays between the transistor control signals.

SUMMARY

A forward converter circuit may include a transformer having a primary winding and a secondary winding, a first transistor coupled in series with the primary winding and a second transistor coupled in series with the secondary winding, the first transistor having a first control terminal and the second transistor having a second control terminal; and a control circuit generating a first control signal for application to the first control terminal and generating a second control signal for application to the second control terminal.

A control circuit in an embodiment (used, for example, to control the forward converter circuit) comprises: a first signal generator adapted to generate a first PWM source signal; a logic circuit adapted to generate a first PWM control signal from the first PWM source signal; a first delay circuit adapted to delay the first PWM control signal and generate a first delayed PWM control signal, the first delay circuit having a programmable first delay; a second delay circuit adapted to delay the first PWM control signal and generate a second delayed PWM control signal, the second delay circuit having a programmable second delay; and a first set/reset circuit having a set input coupled to receive the first delayed PWM control signal and a reset input coupled to receive the second delayed PWM control signal, the first set/reset circuit further having an output generating a first PWM output control signal having a duty cycle controlled by the first delayed PWM control signal and the second delayed PWM control signal.

A control circuit in another embodiment (used, for example, to control the forward converter circuit) comprises: a circuit adapted to generate a PWM control signal; a first delay circuit adapted to delay the PWM control signal and generate a first delayed PWM control signal, the first delay circuit having a programmable first delay to position a rising edge of the first delayed PWM control signal; a second delay circuit adapted to delay the PWM control signal and generate a second delayed PWM control signal, the second delay circuit having a programmable second delay to position a rising edge of the second delayed PWM control signal; and a set/reset circuit having a set input coupled to receive the first delayed PWM control signal and a reset input coupled to receive the second delayed PWM control signal, the set/reset circuit further having an output generating a PWM output control signal having a duty cycle controlled by the positions of the rising edge of the first delayed PWM control signal and the rising edge of the second delayed PWM control signal.

A control circuit in another embodiment (used, for example, to control the forward converter circuit) comprises: a first delay circuit adapted to delay a PWM control signal and generate a first delayed PWM control signal, the first delay circuit having a programmable first delay; a second delay circuit adapted to delay the PWM control signal and generate a second delayed PWM control signal, the second delay circuit having a programmable second delay; and a PWM signal generation circuit having a first input coupled to receive the first delayed PWM control signal and a second input coupled to receive the second delayed PWM control signal, the PWM signal generation circuit further having an output, the PWM signal generation circuit setting the output to a first logic state in response to the first delayed PWM control signal and setting the output to a second logic state in response to the second delayed PWM control signal.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1A:
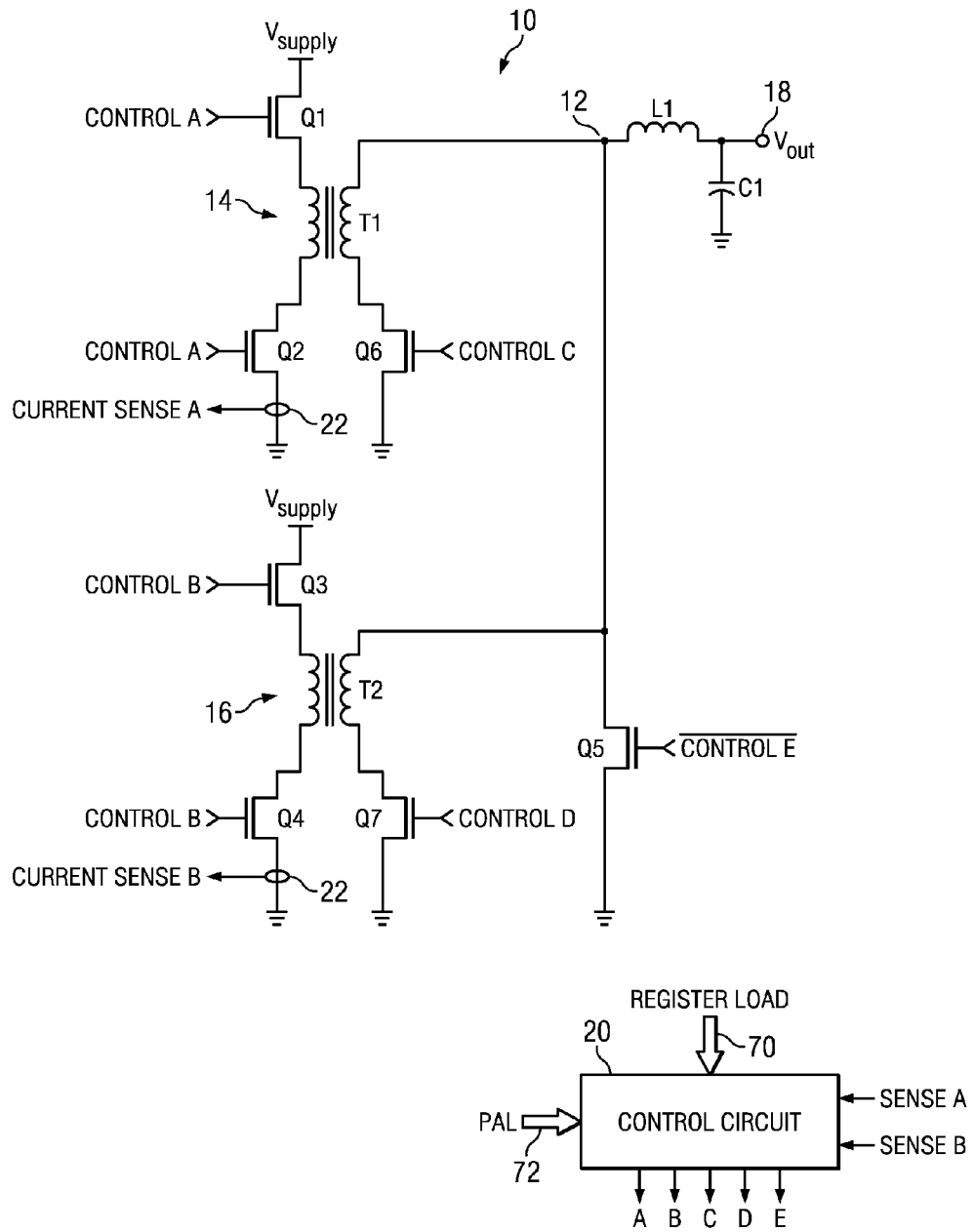
FIGS. 1A and 1B are schematic diagrams of power stage embodiments.

Reference is now made to FIG. 1A which shows a schematic diagram of a power stage 10 implementing a step-down power conversion. The power stage 10 receives a supply voltage Vsupply and outputs an output voltage Vout. The supply voltage Vsupply may be generated in any suitable manner from any suitable source and is, in one implementation, a high voltage on the order of greater than +300V (obtained, for example, by doubling and rectifying a 115V supply). The output voltage Vout is, relative to the supply voltage Vsupply, a low voltage on the order of about +12V with an average current of about 8 A. It will be understood, however, that a step down converter is not the only implementation within the scope of the present invention. The invention may also be applicable to the control of a step up power converter.

The supply voltage Vsupply is applied to the drain of an nMOS transistor Q1. The gate of nMOS transistor Q1 receives a control signal CONTROL A. The source of that nMOS transistor Q1 is coupled to a first terminal of a primary winding of transformer T1. A second terminal of the primary winding of transformer T1 is coupled to the drain of an nMOS transistor Q2 whose source is coupled to a ground reference. The gate of nMOS transistor Q2 also receives the control signal CONTROL A. The secondary winding of transformer T1 includes a first terminal coupled to node 12 and a second terminal coupled to the drain of an nMOS transistor Q6 whose source is coupled to the ground reference to form an active rectification path. The gate of nMOS transistor Q6 receives a control signal CONTROL C. The foregoing circuitry forms a first forward converter circuit 14.

The supply voltage Vsupply is applied to the drain of an nMOS transistor Q3. The gate of nMOS transistor Q3 receives a control signal CONTROL B. The source of that nMOS transistor Q3 is coupled to a first terminal of a primary winding of transformer T2. A second terminal of the primary winding of transformer T2 is coupled to the drain of an nMOS transistor Q4 whose source is coupled to a ground reference. The gate of nMOS transistor Q4 also receives the control signal CONTROL B. The secondary winding of transformer T2 includes a first terminal coupled to node 12 and a second terminal coupled to the drain of an nMOS transistor Q7 whose source is coupled to the ground reference to form an active rectification path. The gate of nMOS transistor Q7 receives a control signal CONTROL D. The foregoing circuitry forms a second forward converter circuit 16.

The outputs of the first and second forward converter circuits 14 and 16 are summed at node 12. An inductor L1 is coupled between node 12 and the output node 18 which supplies the output voltage Vout. A capacitor C1 is coupled between the output node 18 and the ground reference. The drain of an nMOS transistor Q5 is coupled to node 12. The source of that nMOS transistor Q5 is coupled to the ground reference to form a recirculation path. The gate of nMOS transistor Q5 receives a control signal CONTROL E (bar). In this configuration, the transistor Q5 is generally coupled in parallel with the secondary windings of both transformers T1 and T2.

The two phase, two transistor forward converter power stage 10 shown in FIG. 1A needs at least five control signals, comprising two control signals on the primary side of transformers T1 and T2 (namely, CONTROL A and CONTROL B) and three control signals on the secondary side of transformers T1 and T2 (namely, CONTROL C, CONTROL D and CONTROL E(bar)). The power stage 10 operates properly only if the control signals CONTROL A to CONTROL E are properly and timely generated.

The two control signals CONTROL A and CONTROL B on the primary side of transformers T1 and T2 control the transistors Q1-Q4 to be turned on at a fixed frequency and phase relationship. These transistors, however, may be turned off in response to a current sensing event (it being understood that the converter can be operated in: a) constant voltage mode where turn on/off is controlled by timing; or b) current mode where turn on is timed and turn off is controlled by detecting peak current). The three control signals on the secondary side of transformers T1 and T2 control the transistors Q5-Q7 to be turned on also at a fixed frequency and phase relationship. These transistors, however, are also turned off in relation to a delay time. There must also be provided a dead time between the synchronous rectification transistors Q6 and Q7 in the active path and the transistor Q5 in the recirculation path, which requires a particular timing relationship between the CONTROL C, CONTROL D and CONTROL E(bar) signals.

A control circuit 20 is provided to generate the control signals CONTROL A to CONTROL E with the proper timing and relationship. The control circuit 20 may be implemented in any suitable manner and is preferably a circuit supporting programmable timing operations as well as having a dynamic response capability. The control circuit receives current sensing inputs (SENSE A and SENSE B). The signals on the current sensing inputs SENSE A and SENSE B represent sensed current flowing on the primary side of transformers T1 and T2, respectively. An appropriate current sensor 22 is provided in the current path of the primary side of each of transformers T1 and T2 to generate the current sensing inputs SENSE A and SENSE B. The current sensor 22 may, for example, comprise a transformer coupled in series with the source of each of transistors Q2 and Q4. The transistor Q5 in FIG. 1A is shown receiving the signal CONTROL E(bar) in order to illustrate that it is controlled out of phase with respect to the other control signals. It will, of course, be understood that the control circuit 20 can be configured to provide complementary state control signals as needed (for example, both CONTROL E and CONTROL E(bar)).

Figure 1B:
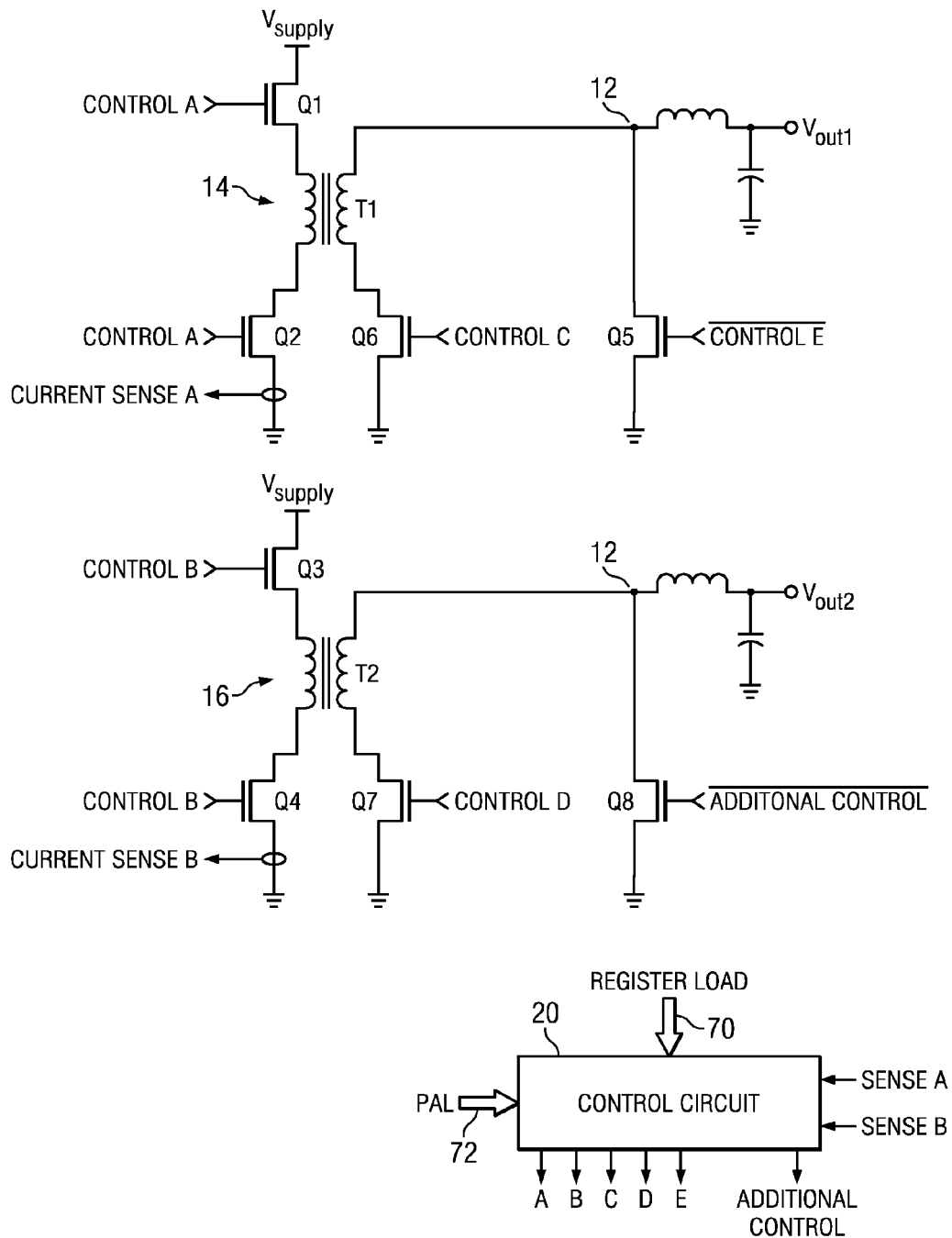

FIG. 1B illustrates an alternative embodiment of a power stage implementing a step-down power conversion comprising two independent single phase forward converter systems 14 and 16. Because the implementation of FIG. 1B has separate recirculation paths, the system utilizes both transistor Q5 (for system 14) and an additional nMOS recirculation transistor Q8 (for system 16). In this configuration, separate nodes 12 are provided for each system, as well as separate inductor L1 and capacitor C1 circuit networks between node 12 and the separate output nodes 18 which each supply an output voltage Vout. The drain of the additional nMOS transistor Q8 is coupled to node 12. The source of that nMOS transistor Q8 is coupled to the ground reference to form the recirculation path for system 16. The gate of nMOS transistor Q8 receives a control signal ADDITIONAL CONTROL (bar). In this configuration, the transistor Q8 is generally coupled in parallel with the secondary windings of transformer T2, while transistor Q5 is generally coupled in parallel with the secondary windings of transformer T1.

A control circuit 20 is provided in FIG. 1B to generate the control signals CONTROL A to ADDITIONAL CONTROL with the proper timing and relationship. The control circuit 20 may be implemented in any suitable manner and is preferably a circuit supporting programmable timing operations. The control circuit receives current sensing inputs (SENSE A and SENSE B). The signals on the current sensing inputs SENSE A and SENSE B represent sensed current flowing on the primary side of transformers T1 and T2, respectively. An appropriate current sensor 22 is provided in the current path of the primary side of each of transformers T1 and T2 to generate the current sensing inputs SENSE A and SENSE B. The current sensor 22 may, for example, comprise a transformer coupled in series with the source of each of transistors Q2 and Q4. The transistors Q5 and Q8 in FIG. 1B are shown receiving the signals CONTROL E(bar) and ADDITIONAL CONTROL(bar) in order to illustrate that they are controlled out of phase with respect to the other control signals. It will, of course, be understood that the control circuit 20 can be configured to provide complementary state control signals as needed.

Figure 2:
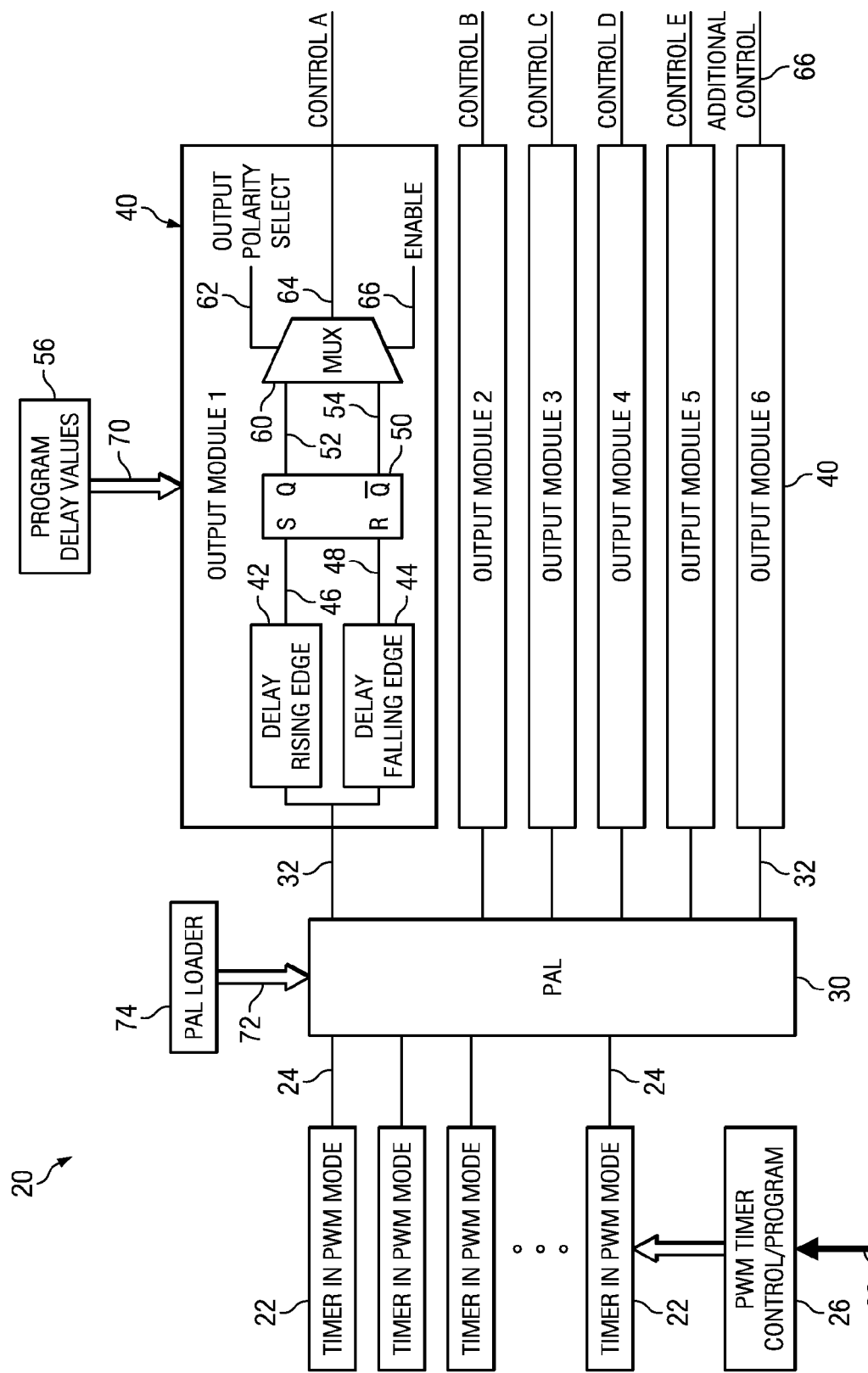
FIG. 2 is a block diagram of a timer control circuit.

Reference is now made to FIG. 2 which illustrates a block diagram of a timer control circuit. Such a timer control circuit could form the functional basis of the control circuit 20 in FIGS. 1A and 1B.

The control circuit 20 includes a plurality of timer circuits 22 operating in PWM mode. In other words, the timer circuits 22 comprise a plurality of PWM signal generators. Such PWM signal generators have a configuration and operation well known to those skilled in the art. Each individual timer circuit 22 is configured to generate a PWM source signal 24. The individual timer circuits 22 may be controlled or programmed, as necessary, to produce the PWM source signal 24 having desired characteristics (frequency, duty cycle, phase, etc.) for a given implementation. Such control or programming is generally shown at reference 26 and the control over the generation of the PWM source signals by timer circuits 22 may be responsive to one or more received external signals 28. For example, the external signals 28 could comprise the output of a comparator and/or output of a current sensor (see, for example, FIGS. 4-6). In this configuration, the PWM is operating in current mode where the PWM output is terminated when the desired peak current is reached. For example, when signals 28 are used to sense the current in the primary of the transformer (see, FIGS. 1A and 1B), PWM output 22 would be set high by a digital timer within circuit 22 and reset low by the external signal 28 that is the output of a comparator sensing the current. Thus, for each circuit 22, each PWM cycle in the signal 24 is initiated by the digital timer and terminated when the desired peak current is reached.

The plurality of PWM source signals 24 are applied to the corresponding inputs of a programmable array logic (PAL) circuit 30. The PAL 30 has a plurality of outputs. The PAL 30 provides a configuration which logically connects the plurality of PWM source signals 24 it receives to the plurality of outputs in generating a plurality of PWM control signals 32. The logical connection implemented by the PAL 30 can, for a given input and an output, simply connect the PWM source signal 24 received at one input to produce a PWM control signal 32 at one (or more) of the PAL outputs having the same configuration. The logical connection implemented by the PAL 30 can, on the other hand, for two or more given inputs and an output, logically combine (for example, logically OR) the PWM source signals 24 received at the two or more inputs to produce a PWM control signal 32 at one (or more) outputs 32. It will be recognized that the PAL 30 could be programmed and implemented in any desired way so as to logically or mathematically combine two or more PWM source signals 24 in producing a desired PWM control signal 32.

A plurality of output modules 40 are connected to corresponding outputs of the PAL 30. Each output module 40 receives one PWM control signal 32 output from the PAL 30. The received PWM control signal 32 is applied to the input of a first programmable delay 42 and is also applied to the input of a second programmable delay 44. The first programmable delay 42 delays the received PWM control signal 32 by a first programmed signal delay value and produces a first delayed PWM control signal 46 (specifically directed to setting a delay relative to setting the location in time of the rising edge of the first delayed PWM control signal 46). The second programmable delay 44 inverts and delays the received PWM control signal 32 by a second programmed signal delay value and produces a second delayed PWM control signal 48 (specifically directed to setting a delay relative to setting the location in time of the rising edge of the inverted second delayed PWM control signal 48—which relates to the falling edge of signal 32). The reason for exercising precise control over the delayed timing (positioning or location in time) of the rising edges the two delayed signals 46 and 48 will be made clear from the discussion below.

The output module 40 further comprises a set-reset circuit 50 (for example, a set-reset flip-flop circuit). A set input (S) of the set-reset circuit 50 receives the first delayed PWM control signal 46. A reset input (R) of the set-reset circuit 50 receives the second delayed PWM control signal 48. The set-reset circuit 50 includes a first (true) output Q and a second (complement) output Q(bar). Responsive to a rising edge of the first delayed PWM control signal 46 at the set input (S) (where the rising edge location in time is set by the first programmable delay 42), if the second delayed PWM control signal 48 at the reset input (R) is logic low, the first (true) output Q of the set-reset circuit 50 goes to logic high. Responsive to a subsequent rising edge of the second delayed PWM control signal 48 at the reset input (R) (where the rising edge location in time is set by the second programmable delay 44), if the first delayed PWM control signal 46 is logic low, the first (true) output Q of the set-reset circuit 50 goes to logic low. The second (complement) output Q(bar) is the complement of the first (true) output Q of the set-reset circuit 50. The first (true) output Q and second (complement) output Q(bar) of the set-reset circuit 50 accordingly produce complementary PWM signals 52 and 54. The duty cycle of the complementary PWM signals 52 and 54 is set by the width of signal 32, the first and second programmed signal delay values and the control exercised over timing (positioning or location in time) of the rising edges of the delayed PWM control signals 46 and 48. A programming circuit 56 is provided to load the first and second programmed signal delay values into the first programmable delay 42 and second programmable delay 44, respectively, thus give the user control over the PWM characteristics of the complementary PWM signals 52 and 54.

The first (true) output Q and second (complement) output Q(bar) of the set-reset circuit 50 are connected to the inputs of a multiplexer (MUX) 60. A first control input 62 of the MUX 60 receives an output polarity select signal. Responsive to the output polarity select signal, the MUX 60 chooses one of the complementary PWM signals 52 and 54 to be delivered from the output module 40 as the PWM output control signal 64. A second control input 66 of the MUX 60 receives an enable signal. Responsive to the enable signal, the MUX 60 is enabled to output the selected one of the complementary PWM signals 52 and 54 as the PWM output control signal 64 (or instead places the output of the MUX 60 in a tristate condition or desired fixed logic condition).

With additional reference to FIGS. 1A and 1B, the control circuit 20 further includes a register load input 70 through which the first and second programmed signal delay values are input (for example, by or through the programming circuit 56) for storage in the first and second programmable delays 42 and 44, respectively. The programming of the PAL 30 within the control circuit 20 can be accomplished by a PAL loader 74 which loads PAL configuration data through a PAL configuration input 72. This PAL configuration data sets the logical or mathematical input-to-output relationships between the PWM source signals 24 and the PWM control signals 32. The loading of the first and second programmed signal delay values and PAL configuration data allows the user to control the timing of the PWM output control signals 64 and, in the implementations shown in FIGS. 1A and 1B, set the phase relationship between the primary side transistor(s), the secondary side transistor(s) for the active path synchronous rectification, and the transistor for the recirculation path synchronous rectification.

Figure 10:
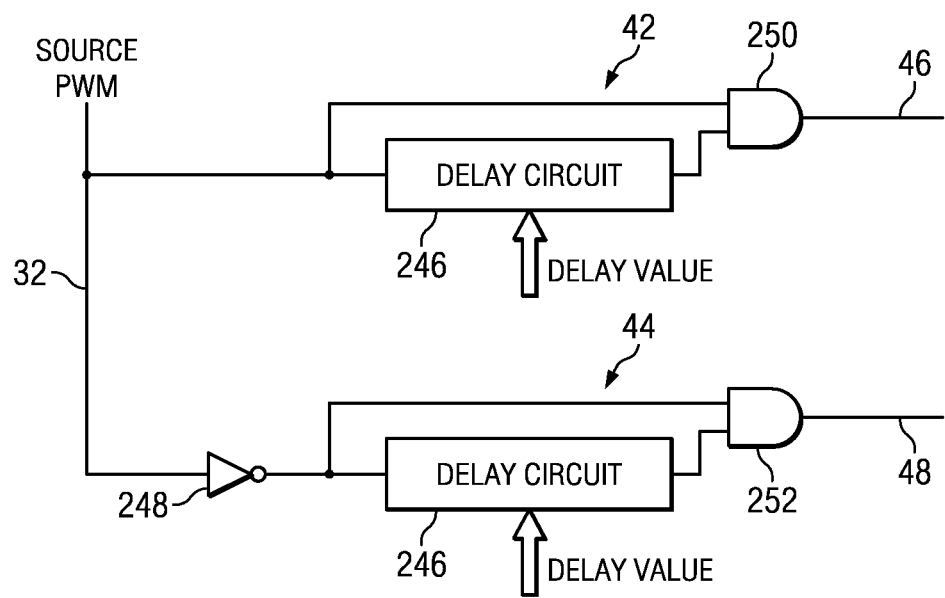
FIG. 10 is a block diagram of programmable delay circuits.

FIG. 10 shows a block diagram of the first and second programmable delays 42 and 44. Each programmable delay 42 and 44 includes a programmable delay circuit 246. A delay value is programmable into the delay circuit 246 within each of the delays 42 and 44. That delay value is loaded into the delay circuit 246.

The PWM source signal 32 is applied directly to the input of the delay circuit 246 of the first programmable delay 42. The PWM source signal 32 is applied to the input of the delay circuit 246 of the second programmable delay 44 through an inverter 248. The first delayed PWM control signal 46 is generated by logically ANDing 250 the output of the delay circuit 246 and the PWM source signal 32. The second delayed PWM control signal 48 is generated by logically ANDing 252 the output of the delay circuit 246 and the inverted PWM source signal 32. The ANDing circuits 250 and 252 are provided to ensure that no condition is present where both the first delayed PWM control signal 46 and second delayed PWM control signal 48 are logic high at the same time.

Figure 3:
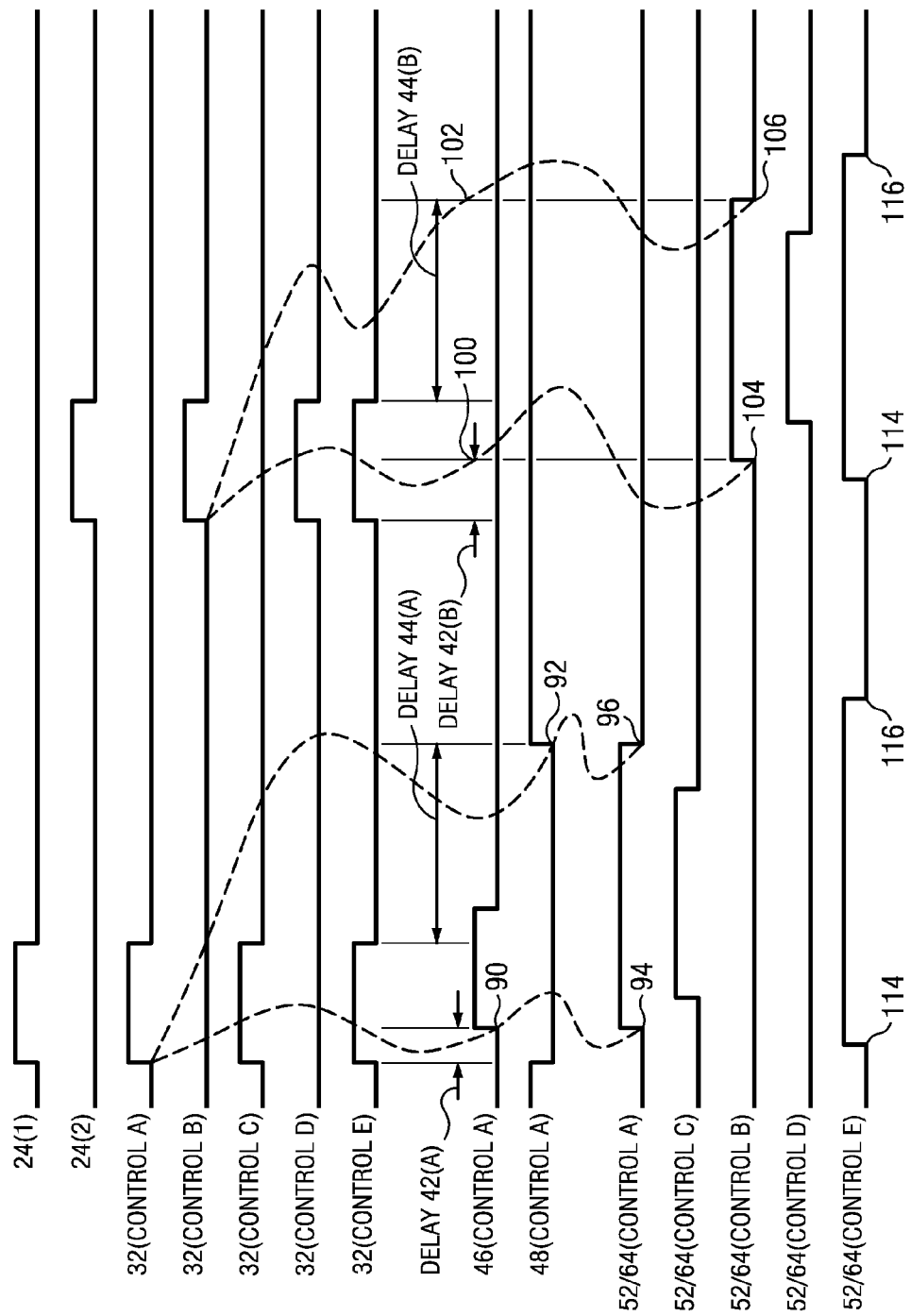
FIG. 3 is a timing diagram illustrating an exemplary operation of the timer control circuit shown in FIG. 2.

Reference is now made to FIG. 3 which shows a timing diagram illustrating an exemplary operation of the circuit shown in FIG. 2. It will be recognized that the signals illustrated in FIG. 3 are exemplary in nature only and are not to be taken as restricting or limiting of the signals that could be used. Furthermore, not all signals are illustrated in FIG. 3. An advantage of the control circuit 20, implemented as shown in FIG. 2, is the flexibility that the circuit provides in generating and manipulating the various signals and circuit components so as to generate any desired PWM control signal at the output of each output module 40.

One of the timer circuits 22 operating in PWM mode is configured to produce a PWM source signal 24(1). The PAL 30 is programmed to pass the PWM source signal 24(1) through for output as a PWM control signal 32 (in this case for CONTROL A). The processing through the PAL 30 may introduce a slight delay (not shown) in PWM control signal 32. The PWM control signal 32 (CONTROL A) is applied to the inputs of the first programmable delay 42 and second programmable delay 44 of the first output module 40 associated with the generation of the output CONTROL A signal. The first programmable delay 42 delays the PWM control signal 32 (CONTROL A) by a programmed signal delay value to generate the first delayed PWM control signal 46 (CONTROL A), and thus set a location 90 in time of the rising edge of the first delayed PWM control signal 46 (CONTROL A). The delay 42(A) illustrates the offset produced by first programmable delay 42 from the rising edge of PWM control signal 32 (CONTROL A) to the rising edge of first delayed PWM control signal 46 (CONTROL A). The second programmable delay 44 inverts and delays the PWM control signal 32 (CONTROL A) by a programmed signal delay value to generate the second delayed PWM control signal 48 (CONTROL A), and thus set a location 92 in time of the rising edge of the second delayed PWM control signal 48 (CONTROL A). The delay 44(A) illustrates the offset produced by second programmable delay 44 from the falling edge of PWM control signal 32 (CONTROL A) to the rising edge of second delayed PWM control signal 48 (CONTROL A). At the rising edge 90 of the first delayed PWM control signal 46 (CONTROL A), the set-reset circuit 50 in the first output module 40 sets the first (true) output Q of the set-reset circuit 50 (PWM signal 52 (CONTROL A)) to logic high (reference 94). At the rising edge 92 of the second delayed PWM control signal 48 (CONTROL A), the set-reset circuit 50 in the first output module 40 sets the first (true) output Q of the set-reset circuit 50 (PWM signal 52 (CONTROL A)) to logic low (reference 96). The PWM signal 52 (CONTROL A) passes through the MUX 60, if enabled and selected by the output polarity select signal, as the PWM output control signal 64 (CONTROL A). This PWM output control signal 64 (CONTROL A) accordingly has characteristics set by the PWM source signal 24(1), the operation of the PAL 30, and the programmed signal delay values of the first programmable delay 42 and second programmable delay 44 such that the rising edge of PWM signal 52 (CONTROL A) is delayed from the rising edge of the PWM source signal 24(1) by a delay equal to the programmed delay 42 and the falling edge of PWM signal 52 is delayed from the falling edge of the PWM source signal 24(1) by a delay equal to programmed delay 44.

Another of the timer circuits 22 operating in PWM mode is configured to produce a PWM source signal 24(2). The PAL 30 is programmed to pass the PWM source signal 24(2) through for output as a PWM control signal 32 (in this case for CONTROL B). The processing through the PAL 30 may introduce a slight delay (not shown). The PWM control signal 32 (CONTROL B) is applied to the inputs of the first programmable delay 42 and second programmable delay 44 of the second output module 40 associated with the generation of the output CONTROL B signal. The first programmable delay 42 delays the PWM control signal 32 (CONTROL B) by a programmed signal delay value to generate the first delayed PWM control signal 46 (CONTROL B), and thus set a location 100 in time of the rising edge of the first delayed PWM control signal 46 (CONTROL B). The delay 42(B) illustrates the offset produced by first programmable delay 42 from the rising edge of PWM control signal 32 (CONTROL B) to the rising edge of first delayed PWM control signal 46 (CONTROL B). The second programmable delay 44 inverts and delays the PWM control signal 32 (CONTROL B) by a programmed signal delay value to generate the second delayed PWM control signal 48 (CONTROL B), and thus set a location 102 in time of the rising edge of the second delayed PWM control signal 48 (CONTROL B). The delay 44(B) illustrates the offset produced by second programmable delay 44 from the falling edge of PWM control signal 32 (CONTROL B) to the rising edge of second delayed PWM control signal 48 (CONTROL B). At the rising edge 100 of the first delayed PWM control signal 46 (CONTROL B), the set-reset circuit 50 in the first output module 40 sets the first (true) output Q of the set-reset circuit 50 (PWM signal 52 (CONTROL B)) to logic high (reference 104). At the rising edge 102 of the second delayed PWM control signal 48 (CONTROL B), the set-reset circuit 50 in the first output module 40 sets the first (true) output Q of the set-reset circuit 50 (PWM signal 52 (CONTROL B)) to logic low (reference 106). The PWM signal 52 (CONTROL B) passes through the MUX 60, if enabled and selected by the output polarity select signal, as the PWM output control signal 64 (CONTROL B). This PWM output control signal 64 (CONTROL B) accordingly has characteristics set by the PWM source signal 24(2), the operation of the PAL 30, and the programmed signal delay values of the first programmable delay 42 and second programmable delay 44 such that the rising edge of PWM signal 52 (CONTROL B) is delayed from the rising edge of the PWM source signal 24(2) by a delay equal to the programmed delay 42 and the falling edge of PWM signal 52 (CONTROL B) is delayed from the falling edge of the PWM source signal 24(2) by a delay equal to programmed delay 44.

The PWM output control signal 64 (CONTROL C) and PWM output control signal 64 (CONTROL D) are each generated by the control circuit 20 in a manner similar to that presented above with respect to PWM output control signal 64 (CONTROL A) and PWM output control signal 64 (CONTROL B). Further detail relating to the generation of the PWM output control signals 64 for CONTROL C and CONTROL D is omitted, but it is understood that one skilled in the art would understand, based on the teachings for the generation of the PWM output control signals 64 for CONTROL A and CONTROL B, how to set the characteristics of the PWM source signal 24, the operation of the PAL 30, and the programmed signal delay values of the first programmable delay 42 and second programmable delay 44 to generate the PWM output control signals 64 for CONTROL C and CONTROL D. The PWM output control signal 64 (CONTROL C) and PWM output control signal 64 (CONTROL D) are shown in FIG. 3.

The PWM control signal 32 may be a logical or mathematical combination by the PAL 30 of the PWM source signals 24(1) and 24(2). An example of this is provided with respect to the generation of PWM output control signal 64 (CONTROL E). The PAL 30 is programmed to logically combine PWM source signals 24(1) and 24(2), in this case with a logical OR function, to generate a PWM control signal 32 (in this case for CONTROL E). The processing through the PAL 30 may introduce a slight delay. The PWM control signal 32 (CONTROL E) is applied to the inputs of the first programmable delay 42 and second programmable delay 44 of the output module 40 associated with the generation of the output CONTROL E signal. The first programmable delay 42 delays the PWM control signal 32 (CONTROL E) by a programmed signal delay values to generate the first delayed PWM control signal 46 (CONTROL E) (not shown), and thus set a location in time of the two rising edges of the first delayed PWM control signal 46 (CONTROL E). The second programmable delay 44 delays the PWM control signal 32 (CONTROL E) by a programmed signal delay value to generate the second delayed PWM control signal 48 (CONTROL E) (not shown), and thus set a location in time of the two rising edges of the second delayed PWM control signal 48 (CONTROL E). At each rising edge of the first delayed PWM control signal 46 (CONTROL E), the set-reset circuit 50 in the output module 40 sets the first (true) output Q of the set-reset circuit 50 (PWM signal 52 (CONTROL E)) to logic high (reference 114). At each of the rising edges of the second delayed PWM control signal 48 (CONTROL E), the set-reset circuit 50 in the output module 40 sets the first (true) output Q of the set-reset circuit 50 (PWM signal 52(CONTROL E)) to logic low (reference 116). The PWM signal 52 (CONTROL E) passes through the MUX 60, if enabled and selected by the output polarity select signal, as the PWM output control signal 64 (CONTROL E). This PWM output control signal 64 (CONTROL E) accordingly has characteristics set by the PWM source signals 24(1) and 24(2), the operation of the PAL 30, and the programmed signal delay values of the first programmable delay 42 and second programmable delay 44.

To the extent a complementary signal is desired, for example, PWM output control signal 64 (CONTROL E(bar)), the output polarity select signal is configured to cause selection of the complementary PWM signal.

The waveforms and relative timing illustrated in FIG. 3 are exemplary in nature, and are provided with reference to one possible operation of the converter shown in FIG. 1A. It will be understood that with appropriate programming and control of the timer circuits 22 operating in PWM mode, the PAL 30, the first programmable delay 42 and the second programmable delay 44 that any arbitrary waveforms and timing relationships can be generated. It can thus be appreciated how a control circuit of the type shown in FIG. 2 can be used in any number of timing control implementations, including for the control circuit 20 of the power stage 10 in FIGS. 1A and 1B.

Thus, it will be recognized that the circuit configuration of FIG. 2 generates multiple PWM outputs that have phase relationships controlled by the timer circuits 22 operating in PWM mode, the PAL 30, the first programmable delays 42 and the second programmable delays 44. The output polarity select signal received at the first control input 62 of the MUX 60 enables selection of inverted or non-inverted output signals with respect to set/reset logic state. This would, for example, facilitate the generation of the complementary CONTROL E(bar) signal or ADDITIONAL SIGNAL(bar) used in FIGS. 1A and 1B to control the recirculation path transistors Q5 and Q8.

Figure 4:
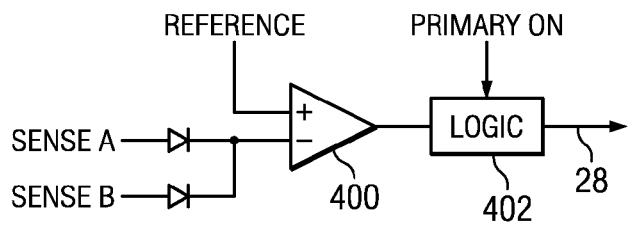
FIGS. 4-6 are circuit diagrams for a current comparison circuit.

The external signals 28 in FIG. 2 may, for example, be generated by a current comparison circuit which compares the received current sensing inputs SENSE A and/or SENSE B to a threshold (see, FIGS. 1A and 1B). The external signals 28 are used to trigger operations of the timer circuits 22 operating in PWM mode. Reference is now made to FIG. 4 which shows a circuit diagram of a current comparison circuit. The current sense signals SENSE A and SENSE B from the primary side of the transformers T1 and T2 are received and summed at the positive input of an operational amplifier 400. The positive input of the operational amplifier 400 receives a reference value. The amplifier 400 compares the summed SENSE A and SENSE B signals to the reference value and generates an output indicative of that comparison which is applied to a first input of a logic circuit 402. A second input of the logic circuit 402 receives an input "Primary On" which is indicative of whether the primary winding of either transformer T1 or transformer T2 is being driven (see, CONTROL A and CONTROL B signals). The logic circuit 402 outputs the external signal 28. That external signal 28 is logic high if the summed SENSE A and SENSE B signals exceed the reference value and either transformer T1 or transformer T2 is being driven.

Figure 5:
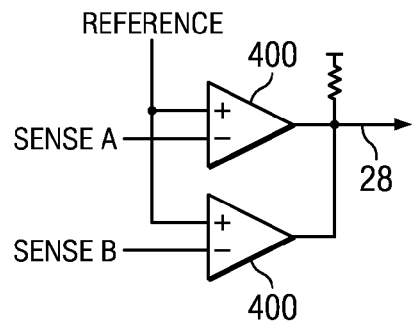
Figure 6:
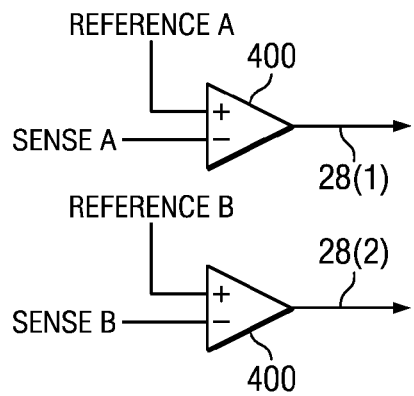

FIGS. 5 and 6 show alternative implementations for the current comparison circuit which also use one or more operational amplifiers 400. FIG. 5 illustrates a circuit where the comparator outputs are combined to generate a single external signal 28. FIG. 6 illustrates a circuit where the separate comparators generate separate external signals 28(1) and 28(2).

Figure 7:
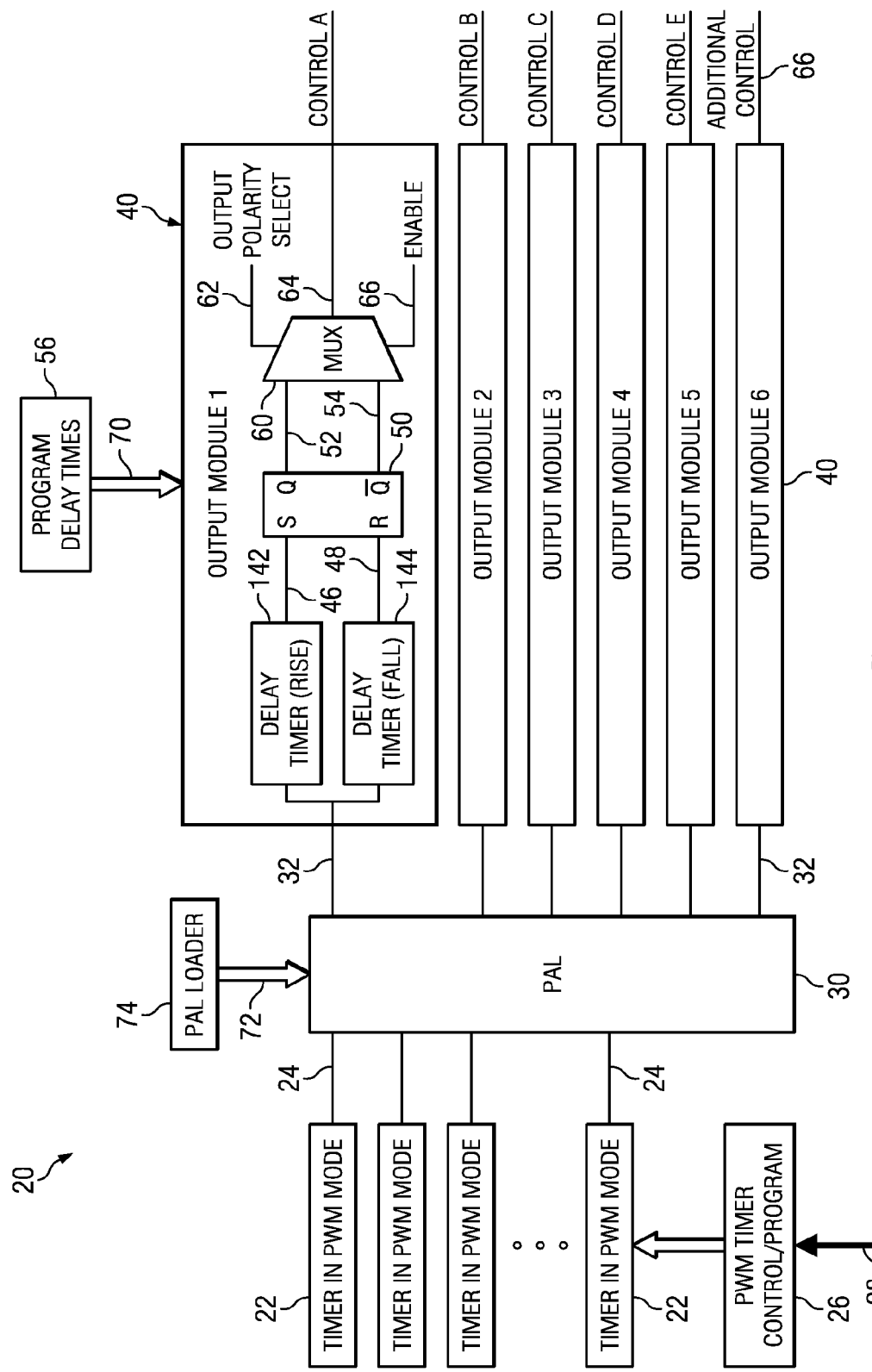
FIG. 7 is a block diagram of an alternative implementation of a timer control circuit.
Figure 8:
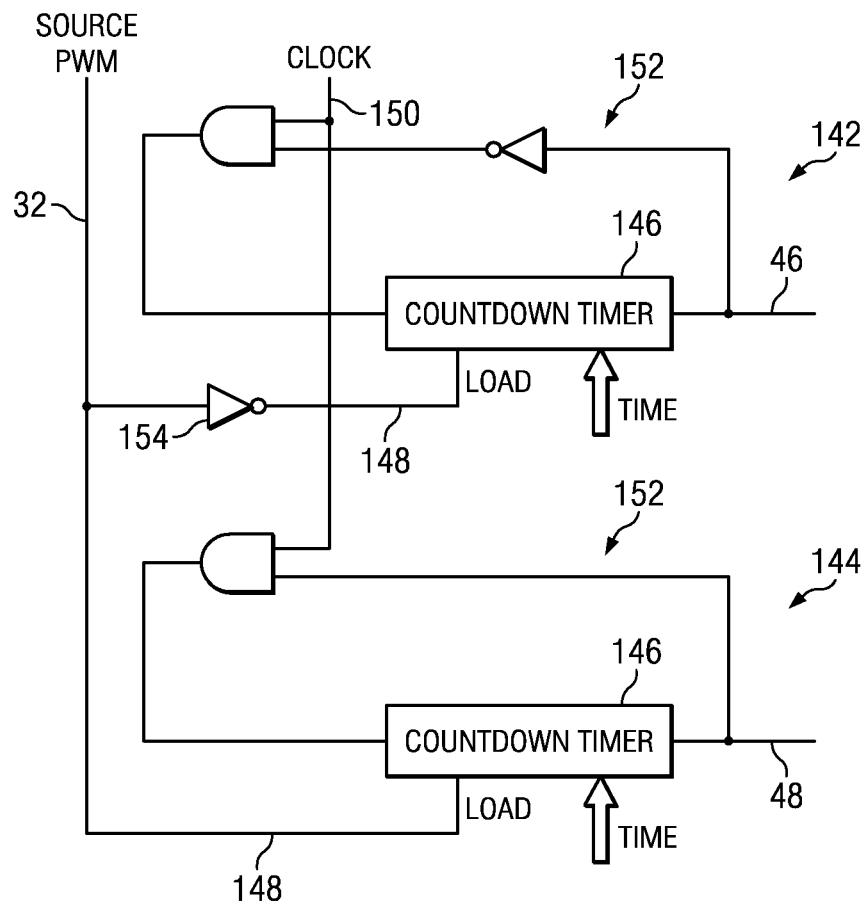
FIG. 8 is a block diagram of programmable delay timers.

Reference is now made to FIG. 7 which illustrates a block diagram of an alternative implementation of a timer control circuit. Such a timer control circuit could form the functional basis of the control circuit 20 in FIGS. 1A and 1B. Like reference numbers refer to same or similar components, and further description of such components is omitted. Reference is made to the description herein of FIG. 2.

The timer control circuit implementation of FIG. 7 differs from that of FIG. 2 in that FIG. 7 utilizes programmable delay timers 142 and 144 instead of delay circuits 42 and 44. FIG.

8 shows a block diagram of the programmable delay timers 142 and 144. Each timer 142 and 144 includes a programmable countdown timer circuit 146. A delay time is programmable into the countdown timer circuit 146 within each of the timers 142 and 144. That delay time is loaded into the timer circuit 146 responsive to a load signal 148. The load signal 148 is derived from the PWM source signal 32. For programmable delay timer 142, the load signal 148 is the logical inversion of the PWM source signal 32. For programmable delay timer 144, the load signal 148 is equal to the PWM source signal 32.

With respect to programmable delay timer 142, when the load signal 148 is in a first logic state, for example logic high, the delay time is loaded into the countdown timer circuit 146 and the output 46 is logic low. When the load signal 148 is in a second logic state, for example logic low, the countdown timer circuit 146 counts down (responsive to clock signal 150) from the loaded delay time towards zero and the output 46 remains logic low during this countdown period. When the countdown timer circuit 146 reaches zero, the output 46 changes to logic high. A feedback path 152 disables application of the clock signal 150 and the timer circuit 146 stops counting.

With respect to programmable delay timer 144, when the load signal 148 is in a first logic state, for example logic high, the delay time is loaded into the countdown timer circuit 146 and the output 48 is logic low. When the load signal 148 is in a second logic state, for example logic low, the countdown timer circuit 146 counts down (responsive to clock signal 150) from the loaded delay time towards zero and the output 48 remains logic low during this countdown period. When the countdown timer circuit 146 reaches zero, the output 48 changes to logic high. A feedback path 152 disables application of the clock signal 150 and the timer circuit 146 stops counting.

Figure 9:
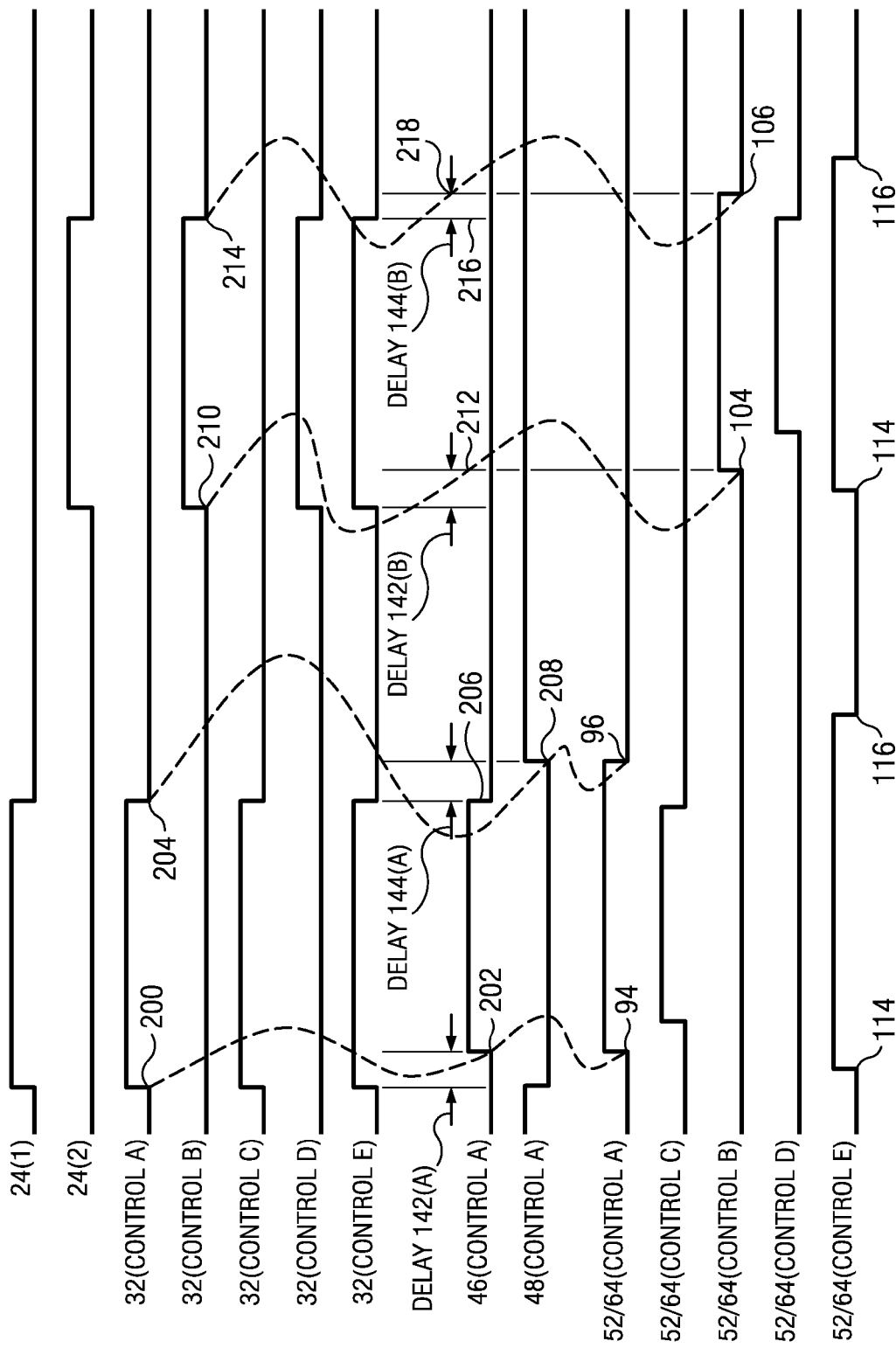
FIG. 9 is a timing diagram illustrating an exemplary operation of the timer control circuit shown in FIG. 7.

Reference is now made to FIG. 9 which shows a timing diagram illustrating an exemplary operation of the circuit shown in FIG. 7. It will be recognized that the signals illustrated in FIG. 9 are exemplary in nature only and are not to be taken as restricting or limiting of the signals that could be used. Furthermore, not all signals are illustrated in FIG. 9. An advantage of the control circuit 20, implemented as shown in FIG. 7, is the flexibility that the circuit provides in generating and manipulating the various signals and circuit components so as to generate any desired PWM control signal at the output of each output module 40.

One of the timer circuits 22 operating in PWM mode is configured to produce a PWM source signal 24(1). The PAL 30 is programmed to pass the PWM source signal 24(1) through for output as a PWM control signal 32 (in this case for CONTROL A). The processing through the PAL 30 may introduce a slight delay (not shown) in PWM control signal 32. The PWM control signal 32 (CONTROL A) is applied to the inputs of the first programmable delay timer 142 and second programmable delay timer 144 of the first output module 40 associated with the generation of the output CONTROL A signal. Responsive to PWM control signal 32 (passing through inverter 154 to generate the load signal 148), a time representing delay 142(A) is loaded into countdown timer circuit 146 and the first delayed PWM control signal 46 (CONTROL A) is logic low. When PWM control signal 32 changes state (reference 200), the countdown timer circuit 146 begins to count down the delay 142(A) after which the first delayed PWM control signal 46 (CONTROL A) changes to logic high (reference 202 setting the location of the rising edge). Responsive to PWM control signal 32 (connected as load signal 148), a time representing delay 144(A) is loaded into countdown timer circuit 146 and the second delayed PWM control signal 48 (CONTROL A) is logic low. When PWM control signal 32 changes state (reference 204), the first delayed PWM control signal 46 (CONTROL A) changes to logic low (reference 206) and the countdown timer circuit 146 begins to count down the delay 144(A) after which the second delayed PWM control signal 48 (CONTROL A) changes to logic high (reference 208 setting the location of the rising edge). At the rising edge 202 of the first delayed PWM control signal 46 (CONTROL A), the set-reset circuit 50 in the first output module 40 sets the first (true) output Q of the set-reset circuit 50 (PWM signal 52 (CONTROL A)) to logic high (reference 94). At the rising edge 208 of the second delayed PWM control signal 48 (CONTROL A), the set-reset circuit 50 in the first output module 40 sets the first (true) output Q of the set-reset circuit 50 (PWM signal 52 (CONTROL A)) to logic low (reference 96). The PWM signal 52 (CONTROL A) passes through the MUX 60, if enabled and selected by the output polarity select signal, as the PWM output control signal 64 (CONTROL A). This PWM output control signal 64 (CONTROL A) accordingly has characteristics set by the PWM source signal 24(1), the operation of the PAL 30, and the programmed time delays of the first programmable delay 142 and second programmable delay 144.

Another of the timer circuits 22 operating in PWM mode is configured to produce a PWM source signal 24(2). The PAL 30 is programmed to pass the PWM source signal 24(2) through for output as a PWM control signal 32 (in this case for CONTROL B). The processing through the PAL 30 may introduce a slight delay (not shown) in PWM control signal 32. The PWM control signal 32 (CONTROL B) is applied to the inputs of the first programmable delay timer 142 and second programmable delay timer 144 of the second output module 40 associated with the generation of the output CONTROL B signal. Responsive to PWM control signal 32 (passing through inverter 154 to generate the load signal 148), a time representing delay 142(B) is loaded into countdown timer circuit 146 and the first delayed PWM control signal 46 (CONTROL B) is logic low. When PWM control signal 32 changes state (reference 210), the countdown timer circuit 146 begins to count down the delay 142(B) after which the first delayed PWM control signal 46 (CONTROL B) changes to logic high (reference 212 setting the location of the rising edge). Responsive to PWM control signal 32 (connected as load signal 148), a time representing delay 144(B) is loaded into countdown timer circuit 146 and the second delayed PWM control signal 48 (CONTROL B) is logic low. When PWM control signal 32 changes state (reference 214), the first delayed PWM control signal 46 (CONTROL B) changes to logic low (reference 216) and the countdown timer circuit 146 begins to count down the delay 144(B) after which the second delayed PWM control signal 48 (CONTROL B) changes to logic high (reference 218 setting the location of the rising edge). At the rising edge 212 of the first delayed PWM control signal 46 (CONTROL B), the set-reset circuit 50 in the second output module 40 sets the first (true) output Q of the set-reset circuit 50 (PWM signal 52 (CONTROL B)) to logic high (reference 104). At the rising edge 218 of the second delayed PWM control signal 48 (CONTROL B), the set-reset circuit 50 in the second output module 40 sets the first (true) output Q of the set-reset circuit 50 (PWM signal 52 (CONTROL B)) to logic low (reference 106). The PWM signal 52 (CONTROL B) passes through the MUX 60, if enabled and selected by the output polarity select signal, as the PWM output control signal 64 (CONTROL B). This PWM output control signal 64 (CONTROL B) accordingly has characteristics set by the PWM source signal 24(2), the operation of the PAL 30, and the programmed time delays of the first programmable delay 142 and second programmable delay 144.

The PWM output control signal 64 (CONTROL C) and PWM output control signal 64 (CONTROL D) are each generated by the control circuit 20 in a manner similar to that presented above with respect to PWM output control signal 64 (CONTROL A) and PWM output control signal 64 (CONTROL B). Further detail relating to the generation of the PWM output control signals 64 for CONTROL C and CONTROL D is omitted, but it is understood that one skilled in the art would understand, based on the teachings for the generation of the PWM output control signals 64 for CONTROL A and CONTROL B, how to set the characteristics of the PWM source signal 24, the operation of the PAL 30, and the programmed signal delay values of the first programmable delay 142 and second programmable delay 144 to generate the PWM output control signals 64 for CONTROL C and CONTROL D. The PWM output control signal 64 (CONTROL C) and PWM output control signal 64 (CONTROL D) are shown in FIG. 9.

The PWM control signal 32 may be a logical or mathematical combination by the PAL 30 of the PWM source signals 24(1) and 24(2). An example of this is provided with respect to the generation of PWM output control signal 64 (CONTROL E). The PAL 30 is programmed to logically combine PWM source signals 24(1) and 24(2), in this case with a logical OR function, to generate a PWM control signal 32 (in this case for CONTROL E). The processing through the PAL 30 may introduce a slight delay. The PWM control signal 32 (CONTROL E) is applied to the inputs of the first programmable delay timer 142 and second programmable delay timer 144 of the output module 40 associated with the generation of the output CONTROL E signal. The countdown timer of the first programmable delay timer 142 is triggered by the PWM control signal 32 (CONTROL E) to generate the first delayed PWM control signal 46 (CONTROL E) (not shown), and thus set a location in time of the two rising edges of the first delayed PWM control signal 46 (CONTROL E). The countdown timer of the second programmable delay timer 144 is triggered by the PWM control signal 32 (CONTROL E) to generate the second delayed PWM control signal 48 (CONTROL E) (not shown), and thus set a location in time of the two rising edges of the second delayed PWM control signal 48 (CONTROL E). At each rising edge of the first delayed PWM control signal 46 (CONTROL E), the set-reset circuit 50 in the output module 40 sets the first (true) output Q of the set-reset circuit 50 (PWM signal 52 (CONTROL E)) to logic high (reference 114). At each of the rising edges of the second delayed PWM control signal 48 (CONTROL E), the set-reset circuit 50 in the output module 40 sets the first (true) output Q of the set-reset circuit 50 (PWM signal 52(CONTROL E)) to logic low (reference 116). The PWM signal 52 (CONTROL E) passes through the MUX 60, if enabled and selected by the output polarity select signal, as the PWM output control signal 64 (CONTROL E). This PWM output control signal 64 (CONTROL E) accordingly has characteristics set by the PWM source signals 24(1) and 24(2), the operation of the PAL 30, and the programmed time delays of the first programmable delay timer 142 and second programmable delay timer 144. To the extent a complementary signal is desired, for example, PWM output control signal 64 (CONTROL E(bar)), the output polarity select signal is configured to cause selection of the complementary PWM signal.

The waveforms and relative timing illustrated in FIG. 9 are exemplary in nature, and are provided with reference to one possible operation of the converter shown in FIG. 1A. It will be understood that with appropriate programming and control of the timer circuits 22 operating in PWM mode, the PAL 30, the first programmable delay timer 142 and the second programmable delay timer 144 that any arbitrary waveforms and timing relationships can be generated. It can thus be appreciated how a control circuit of the type shown in FIG. 7 can be used in any number of timing control implementations, including for the control circuit 20 of the power stage 10 in FIGS. 1A and 1B.

With the control circuit 20 of FIGS. 2 and 7, the output CONTROL signals can be associated with distinct switching events, for example, the turning on and off of the switches on the primary and secondary sides of a transformer as in the power converter of FIGS. 1A and 1B. Additionally, any arbitrary phase shift can be generated between the output CONTROL signals in response to the external signals 28 as well as the programming of the first and second delays.

It will be recognized that the control circuit 20 can be programmed and controlled for use in controlling the operation of a dual phase forward converter system such as that shown in FIG. 1A, or alternatively be used to control two independent single phase forward converter systems such as that shown in FIG. 1B. However, one skilled in the art will readily recognize the applicability of the control circuit 20 to controlling the operation of many different types of circuits (as well as the use of the control circuit 20 in many different types of applications) including other power conversion circuits (such as, for example, a flyback converter or a single transistor forward converter), motor driver circuits (such as, for example, a multi-phase motor driver), and other applications which require or benefit from the application of PWM control signals.

It will further be recognized that the solutions described herein are scalable with need. For example, consider a circumstance where the power stage has a full bridge design. In this type of circuit, there will be a need to generate four distinct signals for the transistors on the primary side of the transformers T1 and T2, two signals for the active synchronization transistors on the secondary side of the transformers T1 and T2, and one signal for the recirculation path transistor. This is seven total signals. The control circuit 20 of FIG. 2 can be easily scaled with the inclusion of additional output modules 40 as needed for the generation of additional CONTROL signals having configurable PWM characteristics.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A circuit, comprising:
a first signal generator adapted to generate a first PWM source signal;
a logic circuit adapted to generate a first PWM control signal from the first PWM source signal;
a first delay circuit adapted to delay a first edge of the first PWM control signal by a programmable first delay and produce a first delayed PWM control signal;
a second delay circuit adapted to delay a second edge of the first PWM control signal by a programmable second delay and produce a second delayed PWM control signal; and
a first set/reset circuit having a set input coupled to receive the first delayed PWM control signal and a reset input coupled to receive the second delayed PWM control signal, the first set/reset circuit further having an output generating a first PWM output control signal having a duty cycle controlled by the delayed first edge in the first delayed PWM control signal and the delayed second edge in the second delayed PWM control signal.

2. The circuit of claim 1 further comprising a second signal generator adapted to generate a second PWM source signal, the logic circuit further adapted to generate the first PWM control signal from a combination of the first PWM source signal and second PWM source signal.

3. The circuit of claim 2 wherein the combination is a logical combination.

4. The circuit of claim 3 wherein the logical combination is a logical OR combination.

5. The circuit of claim 2 wherein the logic circuit is programmable, and the combination is programmed into the logic circuit.

6. The circuit of claim 1 further comprising a circuit to program the programmable first and second delays into the first and second delay circuits, respectively.

7. The circuit of claim 1 further comprising: a forward converter circuit including a transformer having a primary winding and a secondary winding, a first transistor coupled in series with the primary winding and a second transistor coupled in series with the secondary winding, the first transistor having the first control terminal and the second transistor having the second control terminal, wherein the first PWM output control signal is applied to at least one of the first and second control terminals.

8. The circuit of claim 1 further comprising: a forward converter circuit including a transformer having a primary winding and a secondary winding, a first transistor coupled in series with the primary winding and a second transistor coupled in series with the secondary winding, the first transistor having the first control terminal and the second transistor having the second control terminal, wherein the forward converter circuit further comprises a third transistor coupled in parallel with the secondary winding, the third transistor having the third control terminal, wherein the first PWM output control signal is applied to at least one of the first, second and third control terminals.

9. The circuit of claim 1 further comprising:
a second signal generator adapted to generate a second PWM source signal;
the logic circuit further adapted to generate a second PWM control signal from the second PWM source signal;
a third delay circuit adapted to delay a first edge of the second PWM control signal by a programmable third delay to generate a third delayed PWM control signal;
a fourth delay circuit adapted to delay a second edge of the second PWM control signal by a programmable fourth delay to generate a fourth delayed PWM control signal; and
a second set/reset circuit having a set input coupled to receive the third delayed PWM control signal and a reset input coupled to receive the fourth delayed PWM control signal, the second set/reset circuit further having an output generating a second PWM output control signal having a duty cycle controlled by the delayed first edge in the third delayed PWM control signal and the delayed second edge in the fourth delayed PWM control signal.

10. The circuit of claim 9 wherein the logic circuit is further adapted to generate the second PWM control signal from a combination of the first PWM source signal and second PWM source signal.

11. The circuit of claim 9 further comprising: a forward converter circuit including a transformer having a primary winding and a secondary winding, a first transistor coupled in series with the primary winding and a second transistor coupled in series with the secondary winding, the first transistor having the first control terminal and the second transistor having the second control terminal, wherein the first PWM output control signal is applied to the first control terminal and the second PWM output signal is applied to the second control terminal.

12. The circuit of claim 9 further comprising: a forward converter circuit including a transformer having a primary winding and a secondary winding, a first transistor coupled in series with the primary winding and a second transistor coupled in series with the secondary winding, the first transistor having the first control terminal and the second transistor having the second control terminal, wherein the forward converter circuit further comprises a third transistor coupled in parallel with the secondary winding, the third transistor having the third control terminal, wherein the first PWM output control signal is applied to one of the first and second control terminals and the second PWM output signal is applied to the third control terminal.

13. A circuit, comprising:
a circuit adapted to generate a PWM control signal;
a first delay circuit adapted to delay a rising edge of the PWM control signal by a programmable first delay to generate a first delayed PWM control signal having a first edge;
a second delay circuit adapted to delay a falling edge of the PWM control signal by a programmable second delay to generate a second delayed PWM control signal having a second edge; and
a set/reset circuit having a set input coupled to receive the first delayed PWM control signal and a reset input coupled to receive the second delayed PWM control signal, the set/reset circuit further having an output generating a PWM output control signal having a duty cycle controlled by the first edge of the first delayed PWM control signal and the second edge of the second delayed PWM control signal.

14. The circuit of claim 13 wherein the circuit adapted to generate a PWM control signal comprises a circuit which combines a first PWM source signal and a second PWM source signal to generate the PWM control signal.

15. The circuit of claim 14 wherein the combination is a logical combination.

16. The circuit of claim 15 wherein the logical combination is a logical OR combination.

17. The circuit of claim 13 further comprising a circuit to program the programmable first and second delays into the first and second delay circuits, respectively.

18. The circuit of claim 13 further comprising: a forward converter circuit including a transformer having a primary winding and a secondary winding, a first transistor coupled in series with the primary winding and a second transistor coupled in series with the secondary winding, the first transistor having the first control terminal and the second transistor having the second control terminal, wherein the PWM output control signal is applied to at least one of the first and second control terminals.

19. A circuit, comprising:
a first delay circuit adapted to delay a PWM control signal by a programmable first delay to generate a first delayed PWM control signal having a first edge;
a second delay circuit adapted to delay the PWM control signal by a programmable second delay to generate a second delayed PWM control signal having a second edge; and a PWM signal generation circuit having a first input coupled to receive the first delayed PWM control signal and a second input coupled to receive the second delayed PWM control signal, the PWM signal generation circuit further having an output, the PWM signal generation circuit setting the output to a first logic state in response to the first edge of the first delayed PWM control signal and setting the output to a second logic state in response to the second edge of the second delayed PWM control signal.

20. The circuit of claim 19 further comprising a circuit to program the programmable first and second delays into the first and second delay circuits, respectively.

21. The circuit of claim 19 further comprising: a forward converter circuit including a transformer having a primary winding and a secondary winding, a first transistor coupled in series with the primary winding and a second transistor coupled in series with the secondary winding, the first transistor having the first control terminal and the second transistor having the second control terminal, wherein the output of the PWM signal generation circuit is applied to at least one of the first and second control terminals.

22. The circuit of claim 19 wherein the PWM signal generation circuit further comprises a circuit adapted to generate complementary output signals.

23. The circuit of claim 22 wherein the PWM signal generation circuit further comprises a circuit adapted to select one of the complementary output signals as a PWM output control signal.

* * * * *